US009202903B2

(12) United States Patent
Radulescu et al.

(10) Patent No.: US 9,202,903 B2
(45) Date of Patent: Dec. 1, 2015

(54) TUNNEL JUNCTION FIELD EFFECT TRANSISTORS HAVING SELF-ALIGNED SOURCE AND GATE ELECTRODES AND METHODS OF FORMING THE SAME

(71) Applicant: Cree, Inc., Durham, NC (US)

(72) Inventors: Fabian Radulescu, Chapel Hill, NC (US); Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/781,905

(22) Filed: Mar. 1, 2013

(65) Prior Publication Data

US 2014/0246699 A1 Sep. 4, 2014

(51) Int. Cl.
| | |
|---|---|
| H01L 29/66 | (2006.01) |
| H01L 29/778 | (2006.01) |
| H01L 29/423 | (2006.01) |
| H01L 29/08 | (2006.01) |
| H01L 29/20 | (2006.01) |
| H01L 29/417 | (2006.01) |

(52) U.S. Cl.
CPC .......... *H01L 29/778* (2013.01); *H01L 29/0847* (2013.01); *H01L 29/0895* (2013.01); *H01L 29/2003* (2013.01); *H01L 29/41766* (2013.01); *H01L 29/42364* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 4,729,967 A | 3/1988 | Armiento | |
| 6,545,357 B2 | 4/2003 | Chopra | |
| 2010/0327322 A1 | 12/2010 | Kub et al. | |
| 2011/0186855 A1 | 8/2011 | Ramdani | |
| 2012/0104502 A1 | 5/2012 | Imori et al. | |

FOREIGN PATENT DOCUMENTS

WO WO 2012/003609 A1 1/2012

OTHER PUBLICATIONS

International Search Report and the Written Opinion of the International Searching Authority Corresponding to International Application No. PCT/US2014/19410, Date of Mailing: Jun. 20, 2014; 13 pages.
L. Yuan et al., "Normally Off AlGaN/GaN Metal—2DEG Tunnel-Junction Field-Effect Transistors," IEEE Electron Device Letters, vol. 32, p. 303 (Mar. 2011).
International Preliminary Report on Patentabiiity Corresponding to International Application No. PCT/US2014/019410, Date of Mailing: Sep. 11, 2015; 7 pages.

*Primary Examiner* — Seahvosh Nikmanesh
(74) *Attorney, Agent, or Firm* — Myers Bigel Sibley & Sajovec, P.A.

(57) ABSTRACT

Methods of forming a transistor include providing a semiconductor epitaxial structure including a channel layer and barrier layer on the channel layer, forming a gate electrode on the barrier layer, etching the semiconductor epitaxial structure using the gate electrode as an etch mask to form a trench in the semiconductor epitaxial structure, and depositing a source metal in the trench. The trench extends at least to the channel layer, and the source metal forms a Schottky junction with the channel layer. Related semiconductor device structures are also disclosed.

12 Claims, 13 Drawing Sheets

TUNNEL JUNCTION FIELD EFFECT TRANSISTORS HAVING SELF-ALIGNED SOURCE AND GATE ELECTRODES AND METHODS OF FORMING THE SAME

FIELD

The present disclosure relates to semiconductor processing, and in particular relates to the fabrication of high electron mobility transistors.

BACKGROUND

A nitride-based semiconductor high-electron-mobility transistor (HEMT) has an epitaxial layer structure including a barrier layer (typically AlGaN) and a channel layer (typically GaN) that together generate a two-dimensional electron gas (2DEG) at their interface. The two-dimensional electron gas forms due to piezoelectric polarization electric fields at gallium nitride/aluminum gallium nitride (GaN/AlGaN) interfaces. The conductivity of the channel layer can be modulated by a gate contact on the barrier layer, which allows current to flow between source and drain contacts on the channel layer.

While nitride-based HEMTs are useful for microwave frequency applications, their usefulness for other applications is limited due to the fact that they are normally ON devices. A normally OFF nitride-based HEMT has been developed by providing a Schottky junction between the source contact and the channel. An example of a normally OFF nitride-based HEMT is shown in L. Yuan et al., "Normally Off AlGaN/GaN Metal-2DEG Tunnel-Junction Field-Effect Transistors," IEEE Electron Device Letters, Vol. 32, p. 303 (March 2011).

A conventional structure of a normally OFF nitride-based tunnel junction HEMT is illustrated in FIG. 1. As shown therein, a normally OFF nitride-based tunnel junction HEMT 10 includes a substrate 12 on which a GaN channel layer 14 is formed. An AlGaN barrier layer 16 is on the GaN channel layer 12 and forms a two-dimensional electron gas 15 at the AlGaN/GaN heterojunction 17.

A reactive ion etching (RIE) mesa isolation using a chlorine/helium (Cl2/He) inductively coupled plasma etch process may be used to define a device mesa. An ohmic drain electrode 18 is deposited using electron-beam (e-beam) evaporation and a rapid thermal anneal.

A source electrode 20 is formed on the opposite side of the channel layer 14 from the drain electrode 18. To form the source electrode 20, the epitaxial structure is etched at least to the level of the 2DEG 15 using, for example, a further Cl2/He etch. The source electrode 20 is formed of a metal, such as titanium-gold, that forms a Schottky contact with the material of the channel layer 14. The source electrode 20 may be deposited using e-beam evaporation and lift-off. The source electrode may be self-aligned to the etched side of the 2DEG 15 by combining photolithography for etch and acetone lift-off steps.

The source electrode 20 forms a tunnel junction 30 with the 2DEG 15 in the channel layer 14. The Schottky barrier height of the contact is about 0.8 eV, while the Schottky barrier width is only a few nanometers. Thus, efficient quantum tunneling may occur at larger currents.

An insulating layer 22, which may include aluminum oxide, is formed on the barrier layer 16 and extending onto the source electrode 20 and drain electrode 18. A gate electrode 26 is then formed, for example by e-beam deposition and liftoff, on the insulating layer between the source 20 and drain 18 electrodes.

Source 24 and drain 28 pads are formed on the source 20 and drain 18 electrodes, respectively.

A HEMT as shown in FIG. 1 may be a normally-off device with a positive threshold voltage, which may reduce power consumption in some applications. The device may also exhibit reverse current blocking at the source-channel interface, which may suppress leakage through the buffer layer as compared to conventional HEMT structures.

SUMMARY

Methods of forming a transistor according to some embodiments includes providing a semiconductor epitaxial structure including a channel layer and barrier layer on the channel layer, forming a gate electrode on the barrier layer, etching the semiconductor epitaxial structure using the gate electrode as an etch mask to form a trench in the semiconductor epitaxial structure, and depositing a source metal in the trench. The trench extends at least to the channel layer, and the source metal forms a Schottky junction with the channel layer.

The methods may further include forming an insulation layer on the barrier layer, and forming the gate electrode may include forming the gate electrode on the insulation layer.

The methods may further include reflowing the source metal after depositing the source metal in the trench to cause the source metal to contact a sidewall of the trench.

The source metal may form a tunnel junction with a two-dimensional electron gas at an interface between the barrier layer and the channel layer.

The methods may further include forming a drain electrode on the semiconductor epitaxial structure, with the drain electrode spaced apart from the gate electrode in a first direction.

The Schottky junction may extend along a sidewall of the channel layer in a second direction that is perpendicular to the first direction. In some embodiments, the Schottky junction may extend along a sidewall of the channel layer in the first direction.

Etching the semiconductor epitaxial structure may include etching the semiconductor epitaxial layer using the gate electrode as an etch mask to form a pair of trenches in the semiconductor epitaxial layer on opposite sides of the gate electrode. The trenches may extend at least to the channel layer. Depositing the source metal may include depositing the source metal in the trenches. The source metal may form Schottky junctions with the channel layer on opposite sides of the gate electrode, with the Schottky junctions extending in the first direction.

Etching the semiconductor epitaxial structure using the gate electrode as the etch mask to form the trench in the semiconductor epitaxial structure may include forming an etch mask on the insulation layer and on the gate electrode, and patterning the etch mask to expose a portion of the insulation layer adjacent the gate electrode and to expose a portion of the gate electrode.

The etch mask may include a first mask layer and a second mask layer on the first mask layer. Patterning the etch mask may include isotropically etching the first mask layer to undercut the second mask layer.

Etching the semiconductor epitaxial structure may include recessing a sidewall of the trench beneath an edge of the gate electrode, and reflowing the source metal after depositing the source metal in the trench to cause the source metal to contact the recessed sidewall of the trench.

A transistor structure according to some embodiments includes a channel layer, and an epitaxial layer structure including a barrier layer on the channel layer. The barrier layer and the channel layer induce a two dimensional electron gas in the channel layer at an interface between the channel layer and the barrier layer. The transistor structure further includes a drain electrode on the epitaxial layer structure, and a gate electrode on the barrier layer and spaced apart from the drain electrode. The gate electrode includes a sidewall opposite the drain electrode. The transistor structure further includes a trench in the epitaxial structure adjacent the sidewall of the gate electrode. The trench extends through the barrier layer and into the channel layer and exposes a sidewall of the channel layer beneath the sidewall of the gate electrode. The transistor structure further includes a source electrode in the trench. The source electrode contacts the sidewall of the channel layer and forms a Schottky junction with the channel layer, and the sidewall of the gate electrode is laterally spaced from the sidewall of the channel layer by less than about 0.2 microns.

The sidewall of the gate electrode may be substantially aligned with the sidewall of the channel layer.

The drain electrode may be spaced apart from the gate electrode in a first direction, and the Schottky junction may extend along a sidewall of the channel layer in a second direction that is perpendicular to the first direction.

The drain electrode may be spaced apart from the gate electrode in a first direction, and the Schottky junction may extend along a sidewall of the channel layer in the first direction.

The structure may further include a second trench in the semiconductor epitaxial layer on an opposite side of the gate electrode from the first trench and a second source electrode in the second trench and contacting the channel layer. The first and second source electrodes may form Schottky junctions with the channel layer on opposite sides of the gate electrode, with the Schottky junctions extending in the first direction.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 4A to 12A are plan views that illustrate intermediate structures in the formation of tunnel junction FET devices according to various embodiments.

FIGS. 4B to 12B are cross-sectional views showing the structures of FIGS. 4A to 12A taken along lines B-B of FIGS. 4A to 12A, respectively.

DETAILED DESCRIPTION OF EMBODIMENTS

Figure 1:
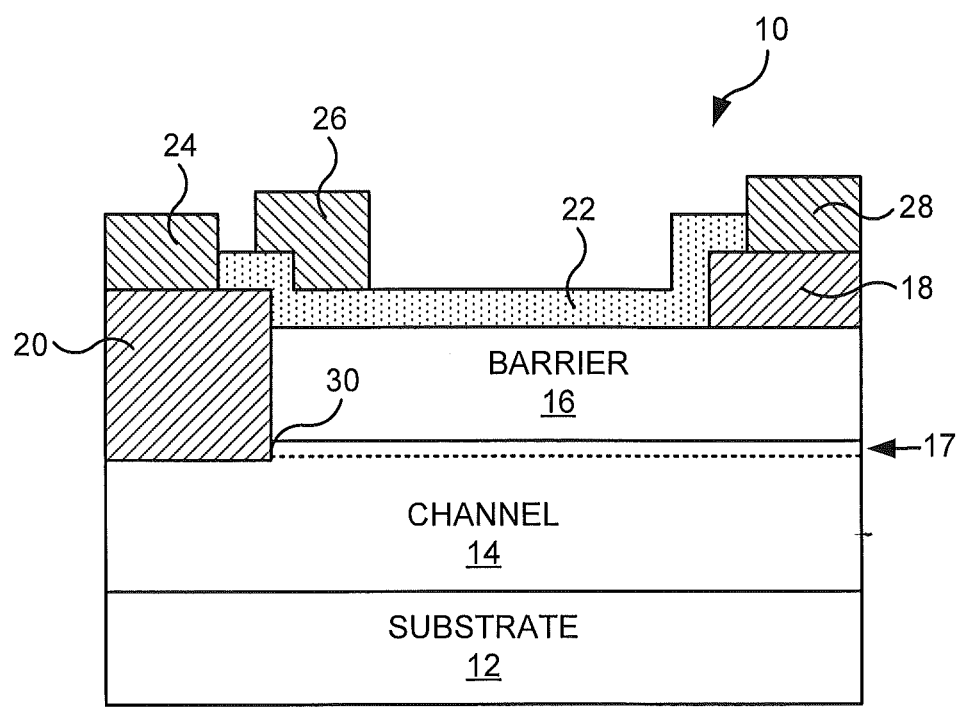
FIG. 1 illustrates a conventional structure of a nitride-based tunnel junction HEMT.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

As discussed above, nitride-based tunnel junction field effect devices can be desirable for certain applications. The operation of such devices is dependent on the ability to fabricate a controllable tunnel junction between the Schottky source electrode and the two-dimensional electron gas (2DEG) in the channel layer.

It is presently understood that the behavior of the tunnel junction is highly sensitive to the spacing between the source electrode and the gate electrode, i.e., the source-gate gap. For example, the switching/modulation operation of a tunnel junction FET is based on the interaction between the voltage applied to the gate electrode and the conduction state of the Schottky junction between the source electrode and the 2DEG in the channel layer. The threshold voltage of the device may be dependent on the geometry of the gate electrode and the spacing between the gate electrode and the tunnel junction.

Yuan et al. disclose that the gate electrode 26 may overlap the source electrode 20 by 0.25 µm so that the tunnel junction can be controlled effectively. However, conventional fabrication methods of nitride-based tunnel junction field effect devices use separate photolithography layers for defining the gate and source electrodes. The precision of the gate-source alignment may therefore be determined by the precision of a stepper.

In contrast, some embodiments of the present inventive concept provide methods of forming a tunnel junction FET in which the gate electrode is self-aligned to the source electrode, and in particular is self-aligned to the junction between the source electrode and the channel layer. Further embodiments provide tunnel junction field effect transistors in which the gate electrode is self-aligned to the source electrode, and in particular is self-aligned to the junction between the source electrode and the channel layer.

The resulting structure may provide an improved level of control over the shape of the electrical field that modulates the conductive state of the junction.

Figure 2A:
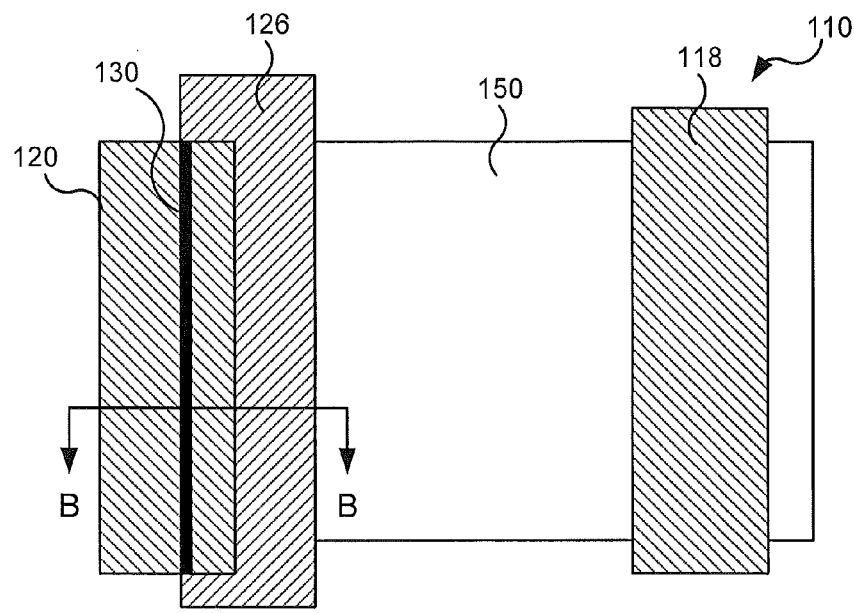
FIG. 2A is a plan view of a single tunneling junction FET structure according to some embodiments.
Figure 2B:
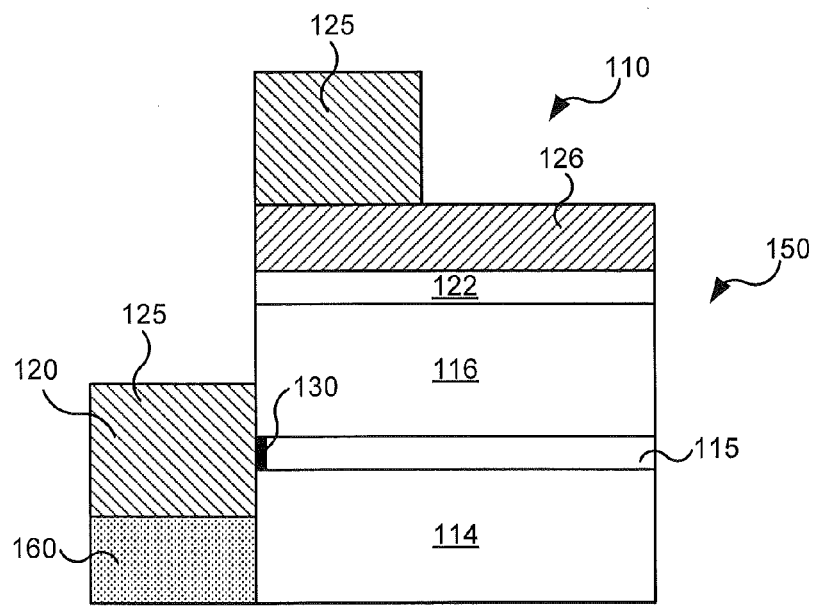
FIG. 2B is a cross-sectional view of the single tunneling junction FET structure of FIG. 2A.
Figure 3A:
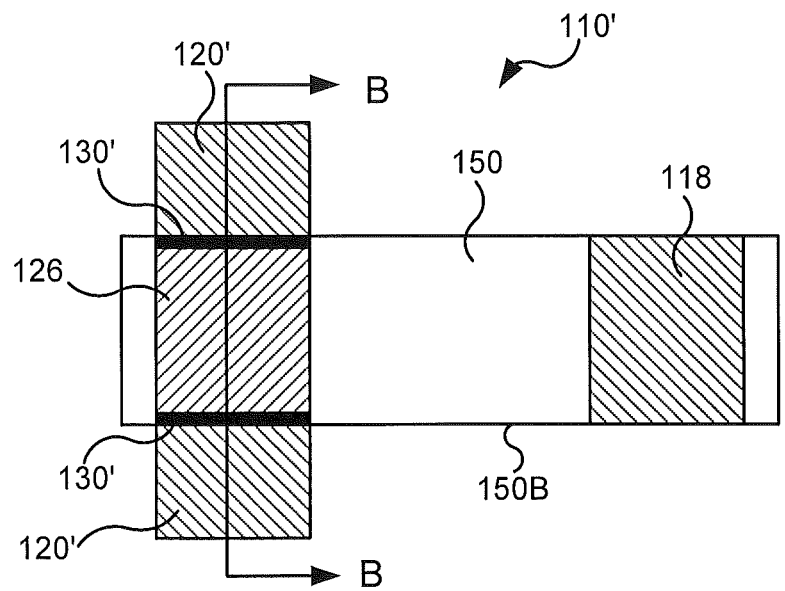
FIG. 3A is a plan view of a double tunneling junction FET structure according to some embodiments.
Figure 3B:
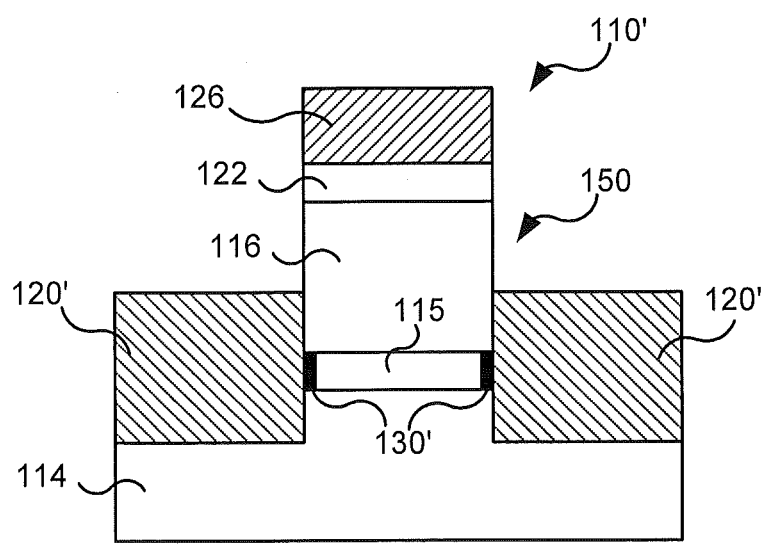
FIG. 3B is a cross-sectional view of the double tunneling junction FET structure of FIG. 3A.

Referring to FIGS. 2A and 3A, tunnel junction transistor structures 110, 110' according to some embodiments are illustrated. FIGS. 2B and 3B are cross-sectional views taken along lines B-B of FIGS. 2A and 3A, respectively. FIGS. 2A and 2B illustrate a single tunneling junction FET that may be suitable, for example, for a device having a wide channel layout, while FIGS. 3A and 3B illustrated a double tunneling junction FET that may be suitable, for example, for a device having a narrow channel layout.

FIGS. 2A and 2B illustrate a single tunneling junction FET structure 110 including an epitaxial structure 150 including a channel layer 114 and a barrier layer 116 that together induce a two-dimensional electron gas 115 at the interface thereof. The channel layer 114 and the barrier layer 116 may include nitride-based materials, such as GaN, AlGaN, InGaN, InAlGaN, AlN, etc. However, it will be appreciated that other semiconductor materials, such as GaAs, AlGaAs, etc. may be used.

An insulator layer 122 is formed on the barrier layer 116. The insulator may include aluminum oxide, silicon oxide, silicon nitride, silicon oxynitride, or any other suitable insulator material. A gate electrode 126 is on the insulator layer 122. A drain electrode 118 that forms an ohmic contact with the 2DEG 115 in the channel layer 114 is on the epitaxial structure 150 and is spaced apart from the gate electrode 126.

The epitaxial structure 150 is recessed on the side of the gate electrode 126 opposite the drain electrode 118 such that a sidewall of the portion of the channel layer 114 in which the 2DEG 115 is formed is exposed.

A Schottky metal 125 is on the structure. A portion of the Schottky metal 125 is on the exposed portion of the channel layer 114 and forms a source electrode 120. Another portion of the Schottky metal 125 is on the gate electrode 126. The source electrode 120 contacts the exposed sidewall of the channel layer to form a lateral metal-semiconductor tunnel junction 130 between the source electrode 120 and the 2DEG 115.

The double tunneling junction FET 110' shown in FIGS. 3A and 3B is similar to the single tunneling junction FET 110 shown in FIGS. 2A and 2B, except that in the FET 110', the Schottky metal 125' is deposited on opposing sides of the gate electrode 126. The Schottky metal 125' forms tunnel junctions 130' with the 2DEG regions 115 of the epitaxial structure 150' that run parallel to a side 150A of the epitaxial region that extends between the gate electrode 126 and the drain electrode 118.

Accordingly, in the double tunneling junction device 110' illustrated in FIGS. 3A and 3B, current flow from the drain electrode 118 to the source electrode 120' follows a right angle path. In contrast, in the single tunneling junction device 110 illustrated in FIGS. 2A and 2B, current flow from the drain electrode 118 to the source electrode 120 follows a straight line path.

FIGS. 4A to 12A illustrate intermediate structures in the formation of tunnel junction FET devices according to various embodiments. FIGS. 4B to 12B are cross-sectional views showing the structures of FIGS. 4A to 12A taken along lines B-B of FIGS. 4A to 12A, respectively.

Figure 4A:
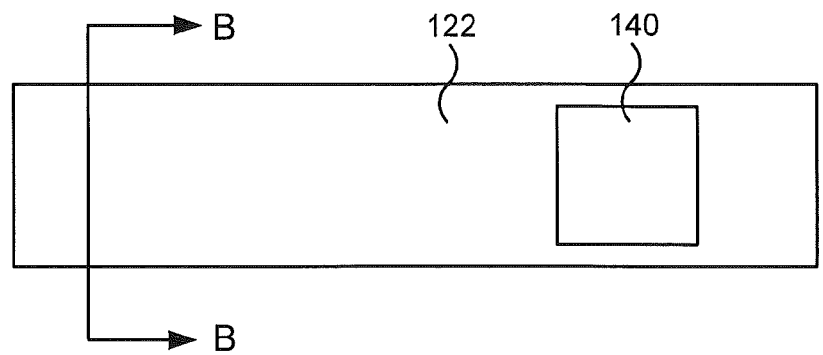
Figure 4B:
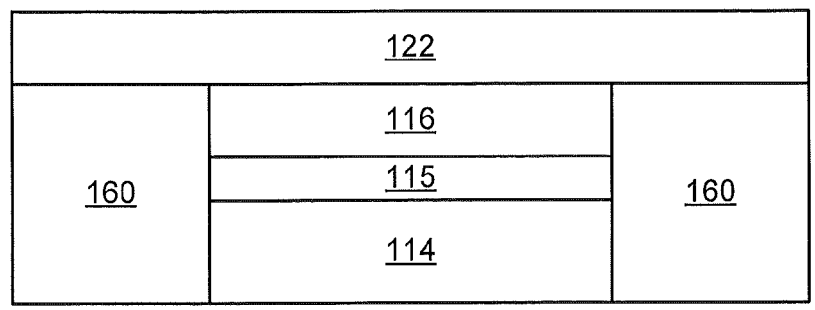

Referring to FIGS. 4A and 4B, an epitaxial structure 150 including a channel layer 114 and a barrier layer 116 is provided. The channel layer 114 and the barrier layer 116 may include nitride-based materials, such as GaN, AlGaN, InGaN, InAlGaN, AlN, etc., or non-nitride materials, such as GaAs, AlGaAs, etc., that can form a 2DEG 115 at their interface. An active region 155 may be defined by implanted isolation regions 160.

An insulator layer 122 is formed on the barrier layer 116. The insulation layer may include, for example, aluminum oxide, silicon oxide, silicon nitride, silicon oxynitride, etc. The insulation layer may be formed, for example, by atomic layer deposition, chemical vapor deposition, or any other suitable method.

A drain contact region 140 is formed in the active region 155. The drain contact region 140 may be formed, for example, by implanting n-type dopants, such as silicon, in the barrier layer 116. To form the drain contact region 140, an n-type dopant, such as silicon, may be implanted into the substrate. Typically, a Si dose of 1E15 at/cm2 or higher may be sufficient to form a low resistance ohmic contact.

Figure 5A:
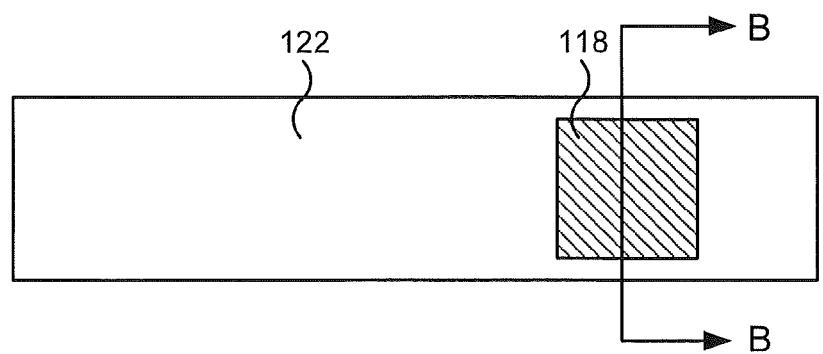
Figure 5B:
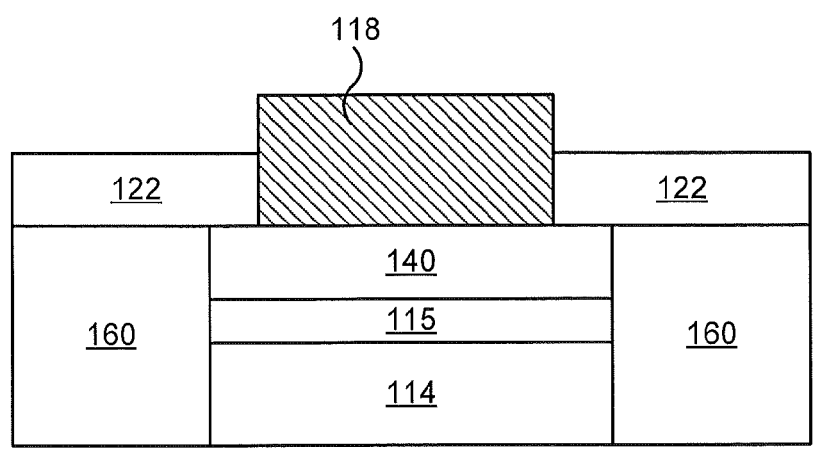

Referring to FIGS. 5A and 5B, the insulation layer 122 is masked and etched to expose the drain contact region 140. A drain electrode 118 is formed on the drain contact region 140. The drain electrode 118 may form an ohmic contact with the drain contact region 140. The drain electrode 118 may be formed, for example, by e-beam deposition and/or evaporation and liftoff of a conductive material, such as Ti—Al, Ti—Al—Au, Ti—Al—Ni, Ti—Al—Ni—Au or Ni—Si. The material may be annealed at a temperature above 500° C. to form an ohmic contact.

Figure 6A:
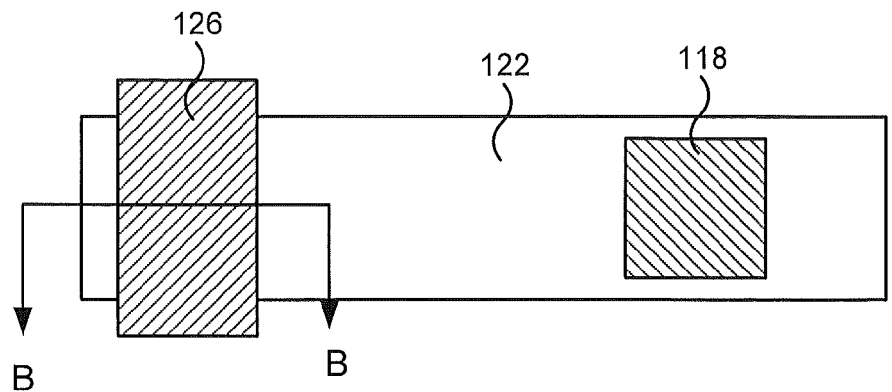
Figure 6B:
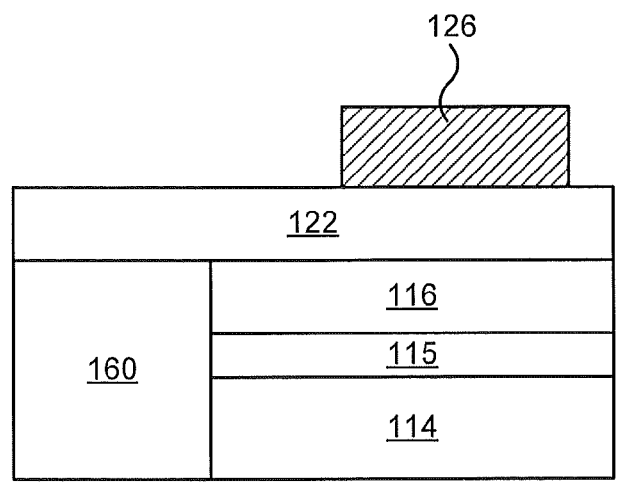

Referring to FIGS. 6A and 6B, a gate electrode 126 is formed on the insulation layer 122. The gate electrode 126 may be formed, for example, by e-beam deposition and/or evaporation and liftoff of Ti/Pt/Au. The gate electrode 126 may be formed on the insulation layer 122 as shown in FIG. 6B, or may be formed directly on the barrier layer 116, in which case the gate electrode 126 may form a non-ohmic junction with the barrier layer 116.

Figure 7A:
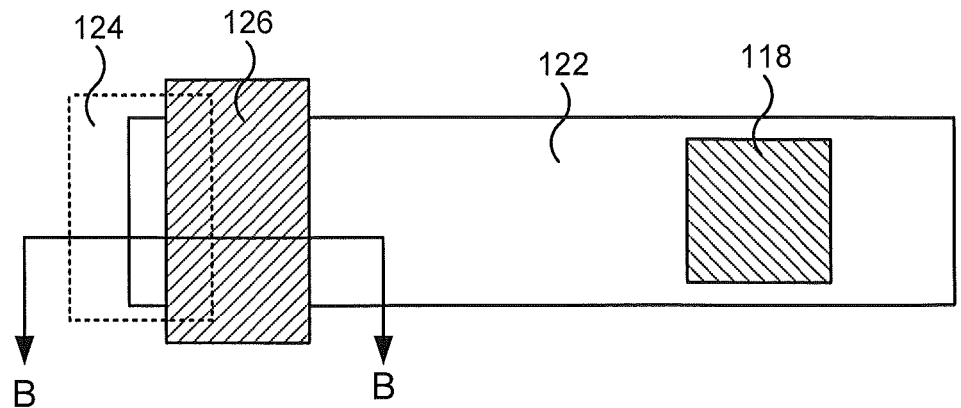
Figure 7B:
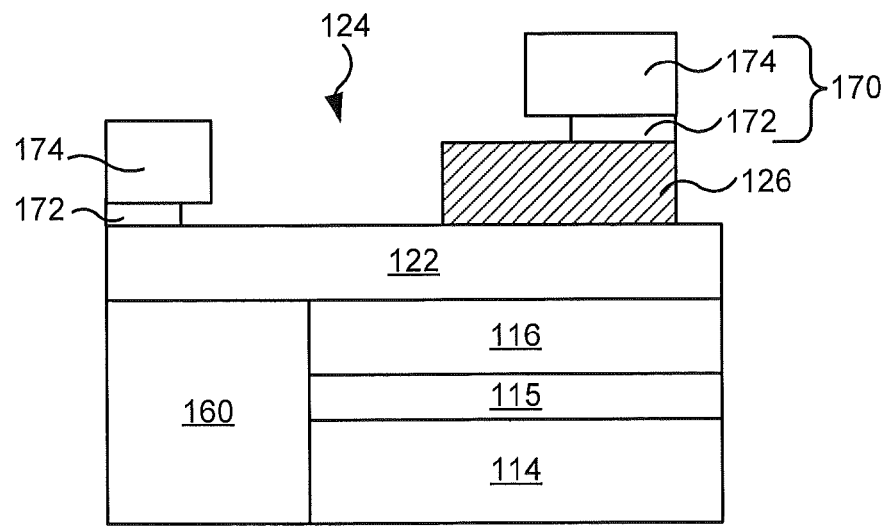

Referring to FIGS. 7A and 7B, a mask 170 is formed on the insulation layer 122 and the gate electrode 126 and pattern to expose a region 124 that overlaps a portion of the gate electrode 126 and the insulation layer 122 opposite the drain electrode 118 on which the source metal will be deposited. (For clarity, FIG. 7A illustrates the complement of the region 124 that is exposed by the mask 170.) The exposed region 124 of the gate electrode 126 and the insulation layer 122 that is exposed by the mask 170 may also overlap the implant isolation region 160 adjacent the active region 155, as illustrated in FIG. 7B.

The mask 170 may be a bi-layer photoresist including a first mask layer 172 and a second mask layer 174. Bi-layer photoresists are known in the art. The first mask layer 172 may be a polydimethylglutarimide based resist, and the second mask layer 174 may be an imaging resist. When the second mask layer 174 is exposed and developed, the first mask layer may dissolve to form the overhang shown in FIG. 7B.

Figure 8A:
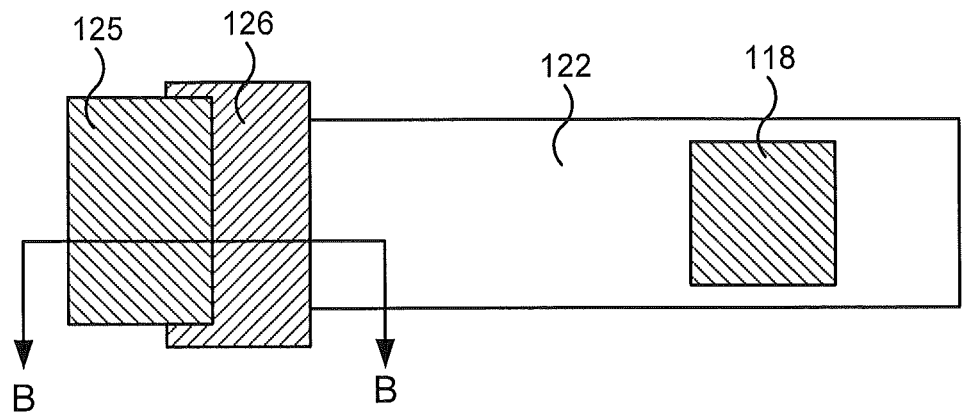
Figure 8B:
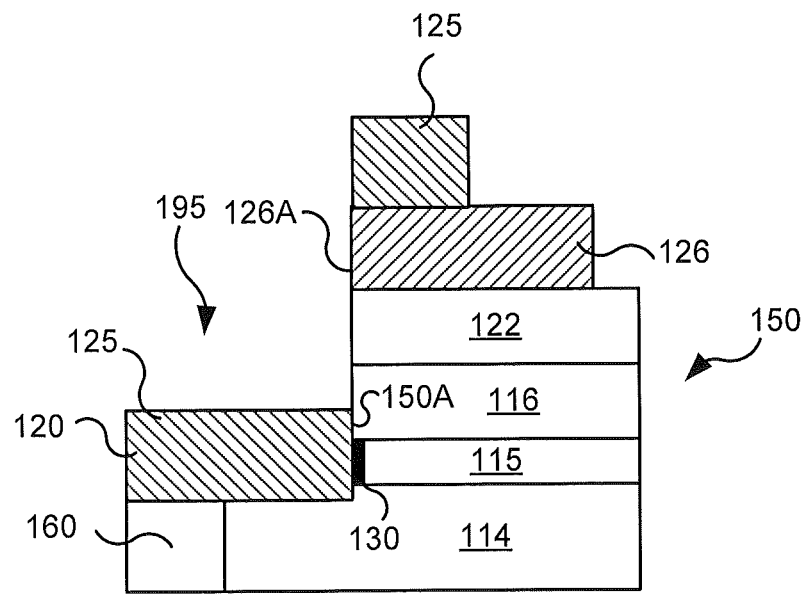

Referring to FIGS. 8A and 8B, the epitaxial structure 150 is etched using the gate electrode 126 and the mask 170 as an etch mask to define a trench 195 in the epitaxial structure 150. The etch may be performed using an anisotropic etch based on $Cl_2$, $BCl_3$ or $SiCl_4$ chemistry. A directional high density ion etch should provide the vertical sidewall profile illustrated in FIG. 8b. The trench 195 is formed to be deeper than the thickness of the barrier layer 116, so that the trench 195 exposes a sidewall 150A of the epitaxial structure 150 including a sidewall of the epitaxial structure adjacent the interface between the channel layer 114 and the barrier layer 116 where the 2DEG 115 is induced.

Still referring to FIGS. 8A and 8B, a source metal 125 is deposited on the etched portion of the epitaxial structure 150 and on the gate electrode 126. The source metal 125 may be deposited, for example, using e-beam deposition and/or evaporation and liftoff. The metal choice should provide a high electron barrier height for the Schottky contact. The metal stack needs to be compatible with a directional deposition method (e.g. evaporation) that reduces/minimizes the sidewall coverage. Possible choices for the source metal include Ni, Ir, Pt, Pd, Mo, TiSi, NiSi or other alloys. The thickness of the source metal 125 may be chosen in such a way that its top surface lays above the interface between epitaxial layers 114 and 116, but is below the interface defined by epitaxial layer 116 and the insulation layer 122. In other words, the boundary limits are defined by the need to contact the channel (layer 115) but to avoid contact with the insulation layer 122

As deposited, the source metal 125 may contact an exposed sidewall of the channel layer 114 where the 2DEG is induced between the channel layer 114 and the barrier layer 116. The source metal 125 may form a Schottky source contact 120 with the channel layer 114 that may under appropriate conditions conduct current to the 2DEG 115 through tunneling.

As shown in FIG. 8A, because the gate electrode 126 is used as an etch mask to define a sidewall of the trench 195 adjacent the channel layer 114, the junction 130 between the source electrode 120 and the channel layer 114 may be formed to be self-aligned with a sidewall 126A of the gate electrode 126. Self-alignment of the junction 130 and the gate electrode 126 may obviate the need to align these features using conventional photolithographic methods, and may increase control over the threshold voltage and/or conductivity of the tunnel junction between the source electrode 120 and the 2DEG 115.

FIGS. 9A, 9B, 10A and 10B illustrated formation of the source electrode 120 and the tunnel junction between the source electrode 120 and the 2DEG 115 according to further embodiments.

Figure 9A:
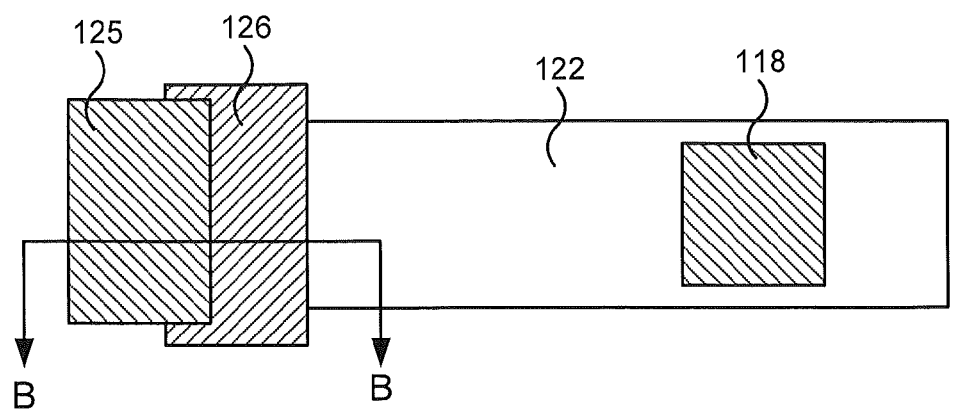
Figure 9B:
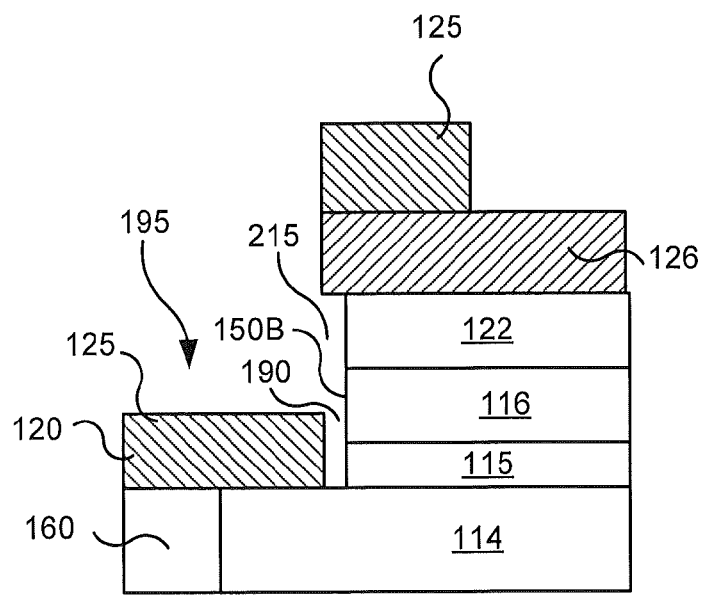
Figure 10A:
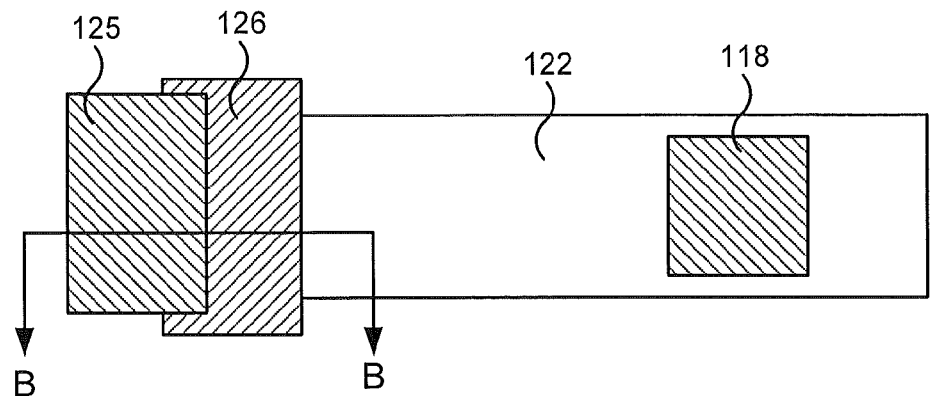
Figure 10B:
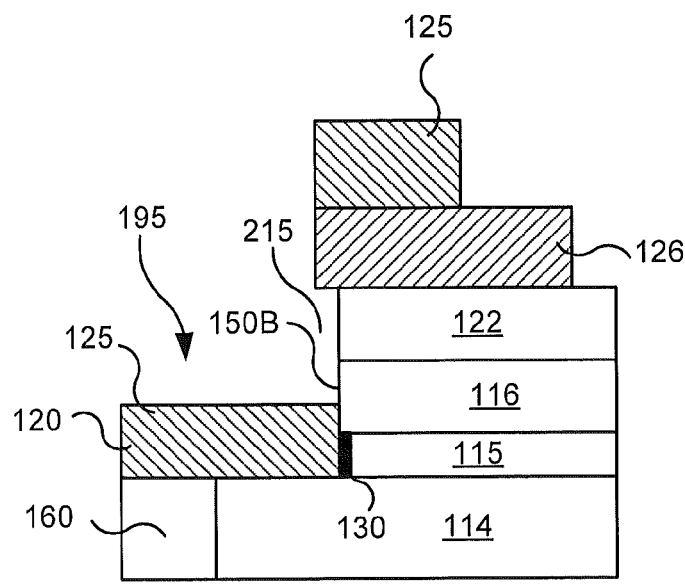

Referring to FIGS. 9A and 9B, in some embodiments, the etch process in which the trench 195 is etched using the gate electrode 126 as an etch mask may result in an undercut 215 of the epitaxial structure 150 beneath the gate electrode 126. Thus, as shown in FIGS. 10A and 10B, when the source metal 125 is deposited in the trench 195, a gap 190 may exist between the source metal 125 and the sidewall 150B of the epitaxial structure 150. The gap 190 may have a width of about 0.05 microns to 0.2 microns, and it can be accomplished by using an isotropic etch. A high pressure, low energy reactive etch based on $Cl_2$, $BCl_3$ or $SiCl_4$ chemistries may create an etch profile as illustrated in FIG. 9B.

Referring still to FIGS. 10A and 10B, the source metal 125 may be reflowed to cause it to contact the sidewall 150B of the epitaxial structure 150 so as to form the junction 130 between the source electrode 120 and the 2DEG 115. In general, heat treating a thin film metal (or alloy) at half its melting temperature will cause it to deform and reflow into a low energy state. The choice of the metal source electrode will depend on the thermal budget of the structure.

FIGS. 11A, 11B, 12A and 12B illustrated formation of the source electrode 120 and the tunnel junction between the source electrode 120 and the 2DEG 115 according to further embodiments.

Figure 11A:
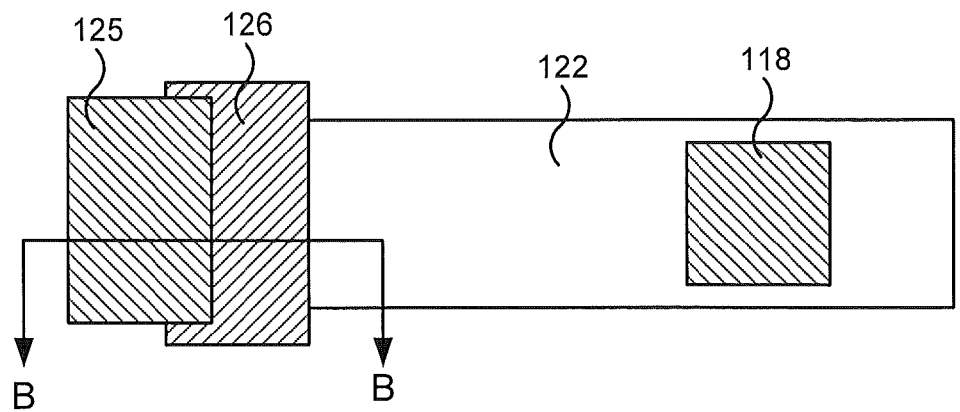
Figure 11B:
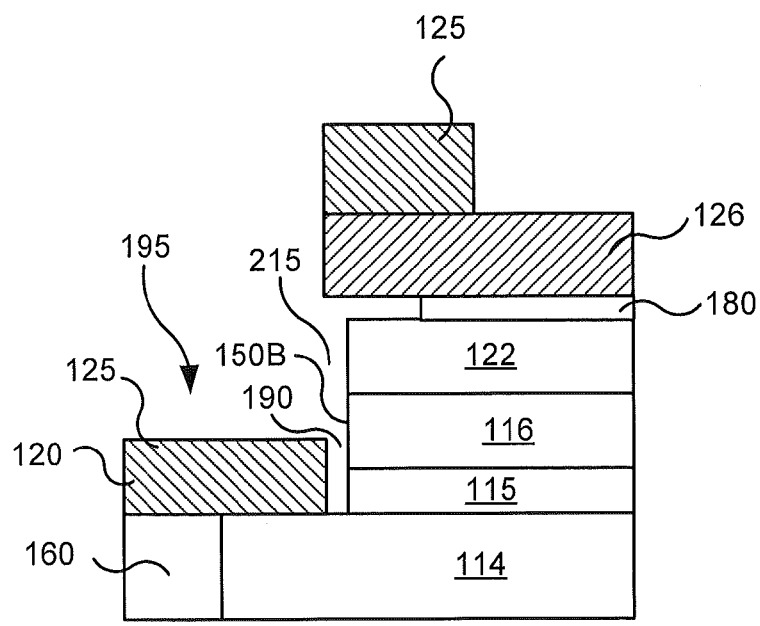

Referring to FIGS. 11A and 11B, in some embodiments, an additional spacer layer 180 may be formed between the insulation layer 122 and the gate electrode 126. The spacer layer 180 is part of an enhanced metal lift-off structure that consists of a bi-layer photo resist. It's role is to improve the lift-off process and provide a clean breaking point for the source metal.

When the spacer layer 180 is present, the etch process in which the trench 195 is etched using the gate electrode 126 as an etch mask may result in an undercut 215 of the epitaxial structure 150 beneath the gate electrode 126. A high pressure, low energy reactive etch based on $Cl_2$, $BCl_3$ or $SiCl_4$ chemistries may create an etch profile as illustrated in FIG. 11B. Thus, as shown in FIGS. 11A and 11B, when the source metal 125 is deposited in the trench 195, a gap 190 may exist between the source metal 125 and the sidewall 150B of the epitaxial structure 150.

Figure 12A:
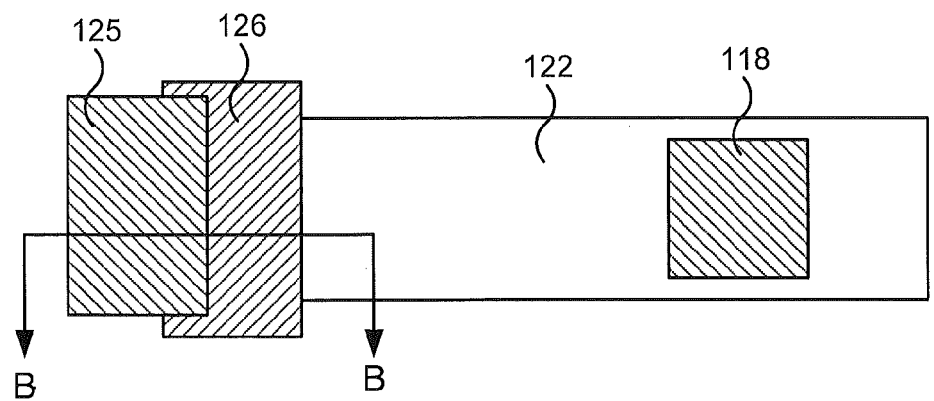
Figure 12B:
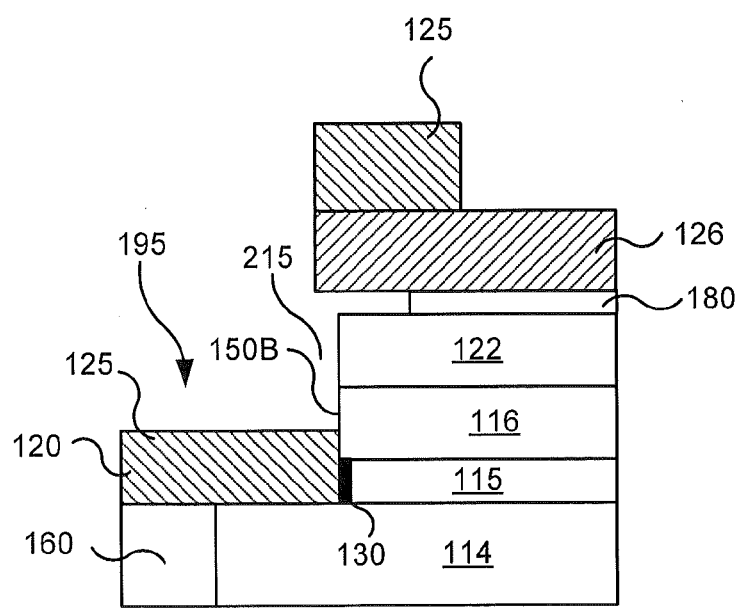

Referring to FIGS. 12A and 12B, the source metal 125 may be reflowed to cause it to contact the sidewall 150B of the epitaxial structure 150 so as to form the junction 130 between the source electrode 120 and the 2DEG 115. As noted above, heat treating a thin film metal (or alloy) at half its melting temperature will cause it to deform and reflow into a low energy state. The choice of the metal source electrode will depend on the thermal budget of the structure.

Figure 13:
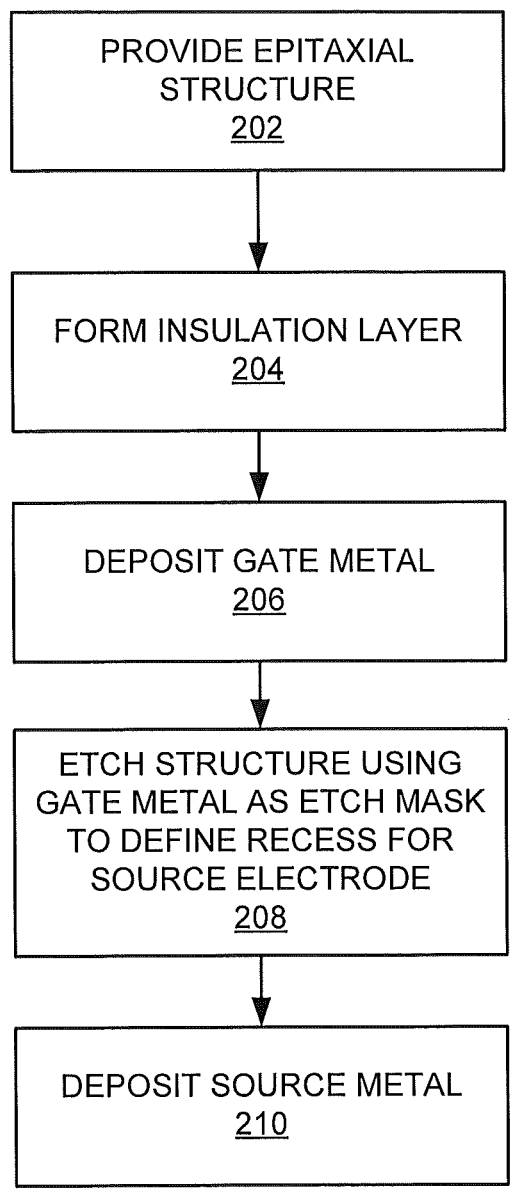
FIG. 13 is a flowchart illustrating operations according to some embodiments.

FIG. 13 is a flowchart illustrating operations 200 according to some embodiments. As shown therein, an epitaxial structure 150 is provided (block 202). An insulation layer 122 is formed on the epitaxial structure 150 (block 204). A gate metal is then deposited and patterned on the insulation layer 122 to form a gate electrode 126 (block 206). As noted above, the insulation layer may be patterned to allow the gate metal to be deposited directly on the epitaxial structure in some embodiments.

Next, the epitaxial structure 150 is etched using the gate electrode 126 as an etch mask to define a trench 195 in the epitaxial structure 150 (block 208). The trench 195 is formed to be at least deeper than the thickness of the barrier layer 116, so that the trench 195 exposes a sidewall 150A of the epitaxial structure 150 including a sidewall of the epitaxial structure adjacent the interface between the channel layer 114 and the barrier layer 116 where the 2DEG 115 is induced.

A source metal 125 is then deposited in trench 195 and may be at least partially deposited on the gate electrode 126 (block 210). The source metal 125 may contact the 2DEG 115 as deposited and/or may be reflowed to cause it to contact the 2DEG.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a transistor, comprising:
providing a semiconductor epitaxial structure including a channel layer and barrier layer on the channel layer;
forming a gate electrode on the barrier layer;
forming a mask on the gate electrode and the barrier layer;
forming an opening in the mask above the barrier layer, the opening exposing an end of the gate electrode;
etching the semiconductor epitaxial structure using the exposed end of the gate electrode as an etch mask to form a trench in the semiconductor epitaxial structure, wherein the trench extends at least to the channel layer; and
depositing a source metal in the trench, wherein the source metal forms a Schottky junction with the channel layer.

2. The method of claim 1, further comprising:
forming an insulation layer on the barrier layer, wherein forming the gate electrode comprises forming the gate electrode on the insulation layer.

3. The method of claim 1, further comprising reflowing the source metal after depositing the source metal in the trench to cause the source metal to contact a sidewall of the trench.

4. The method of claim 1, wherein the source metal forms a tunnel junction with a two-dimensional electron gas formed at an interface between the barrier layer and the channel layer.

5. The method of claim 1, further comprising forming a drain electrode on the semiconductor epitaxial structure, wherein the drain electrode is spaced apart from the gate electrode in a first direction.

6. The method of claim 5, wherein the Schottky junction extends along a sidewall of the channel layer in a second direction that is perpendicular to the first direction.

7. The method of claim 5, wherein the Schottky junction extends along a sidewall of the channel layer in the first direction.

8. The method of claim 7, wherein etching the semiconductor epitaxial structure comprises etching the semiconductor epitaxial layer using the gate electrode as an etch mask to form a pair of trenches in the semiconductor epitaxial layer on opposite sides of the gate electrode, wherein the trenches extend at least to the channel layer, and wherein the pair of trenches are spaced apart in a second direction that is perpendicular to the first direction; and
wherein depositing the source metal comprises depositing the source metal in the trenches, wherein the source metal forms Schottky junctions with the channel layer on opposite sides of the gate electrode, the Schottky junctions extending in the first direction.

9. The method of claim 2, wherein the mask is formed on the insulation layer and on the gate electrode, and patterning the mask to expose a portion of the insulation layer adjacent the gate electrode.

10. The method of claim 9, wherein the mask comprises a first mask layer and a second mask layer on the first mask layer, wherein patterning the mask comprises isotropically etching the first mask layer to undercut the second mask layer.

11. The method of claim 1, wherein etching the semiconductor epitaxial structure comprises recessing a sidewall of the trench beneath an edge of the gate electrode, and reflowing the source metal after depositing the source metal in the trench to cause the source metal to contact the recessed sidewall of the trench.

12. The method of claim 1, wherein the transistor structure comprises a high electron mobility transistor structure.

* * * * *

UNITED STATES PATENT AND TRADEMARK OFFICE
CERTIFICATE OF CORRECTION

PATENT NO. : 9,202,903 B2  
APPLICATION NO. : 13/781905  
DATED : December 1, 2015  
INVENTOR(S) : Radulescu et al.

Page 1 of 1

It is certified that error appears in the above-identified patent and that said Letters Patent is hereby corrected as shown below:

In the Specification:
Column 7, Line 29: Please correct "layer 122" to read -- layer 122. --

In the Claims:
Column 9, Claim 1, Line 13: Please correct "barrier laver," to read -- barrier layer, --

Signed and Sealed this
Thirty-first Day of May, 2016

Michelle K. Lee
*Director of the United States Patent and Trademark Office*